(12) United States Patent
Duchesne et al.

(10) Patent No.: US 7,559,446 B2
(45) Date of Patent: Jul. 14, 2009

(54) AUTOMATED DICING TOOL FOR SEMICONDUCTOR SUBSTRATE MATERIALS

(75) Inventors: Pierre-Luc Duchesne, Shefford (CA); Pierre Laroche, Rock Forest (CA); Nicolas Tessier, Granby (CA); Roch Thivierge, Granby (CA); Stephane Vanier, Granby (CA)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 11/275,319

(22) Filed: Dec. 22, 2005

(65) Prior Publication Data

US 2006/0143908 A1 Jul. 6, 2006

(30) Foreign Application Priority Data

Dec. 22, 2004 (CA) .................................. 2490849

(51) Int. Cl.
*B26F 3/00* (2006.01)

(52) U.S. Cl. .......................................... 225/96.5; 225/2

(58) Field of Classification Search .................. 225/2, 225/96.5; 438/464
See application file for complete search history.

(56) References Cited

U.S. PATENT DOCUMENTS

| | | | | | |
|---|---|---|---|---|---|
| 3,182,873 | A | * | 5/1965 | Kalvelage et al. | 225/2 |
| 3,396,452 | A | * | 8/1968 | Sato et al. | 225/2 |
| 3,493,155 | A | * | 2/1970 | Litant et al. | 225/2 |
| 3,507,426 | A | * | 4/1970 | Bielen et al. | 225/2 |
| 3,667,661 | A | * | 6/1972 | Farmer | 225/2 |
| 3,730,410 | A | * | 5/1973 | Altshuler | 225/96.5 |
| 3,743,148 | A | | 7/1973 | Carlson | |
| 3,786,973 | A | | 1/1974 | Bussman et al. | |
| 4,247,031 | A | | 1/1981 | Pote et al. | |
| 4,865,241 | A | | 9/1989 | Hamel | |
| 5,310,104 | A | * | 5/1994 | Zaidel et al. | 225/2 |
| 5,710,065 | A | * | 1/1998 | Alfaro | 225/1 |
| 5,839,337 | A | * | 11/1998 | Neu | 83/255 |
| 6,248,648 | B1 | * | 6/2001 | McKenna et al. | 438/464 |

* cited by examiner

*Primary Examiner*—Stephen Choi
(74) *Attorney, Agent, or Firm*—Michael LeStrange (57) ABSTRACT

An apparatus for subdividing a sheet of brittle insulating material with a plurality of semiconductor chips disposed thereon. The chips are separated by row and column kerfs each of which contains a respective scribed line. The subdivision of the sheet is accomplished by placing the sheet in a flexible conformable carrier having an open grid, formed of ribs, with each rib positioned over a respective scribe line on the surface of the sheet and forcing the sheet against an arched anvil, thereby fracturing the sheet along the scribe lines.

10 Claims, 5 Drawing Sheets

AUTOMATED DICING TOOL FOR SEMICONDUCTOR SUBSTRATE MATERIALS

FIELD OF THE INVENTION

This invention generally relates to a method and an apparatus for subdividing or dicing a sheet of brittle insulating material into a plurality of discrete or individual regular sections or arrays and more particularly relates to an apparatus and method for the automatic separation or singularization of a sheet of brittle insulating material, having a plurality of semiconductor chips mounted thereon, so that each discrete chip is provided with its own respective insulating substrate such that it can easily be included in an electronic package.

BACKGROUND OF THE INVENTION

As is well known, a plurality of semiconductor circuits, are formed in large semiconductor wafers. The circuits are typically arranged on the wafer in rows and columns separated one from the other by regions known as kerfs. Once the circuits are formed in the wafer; metallic connections are provided on the surface of each circuit; the circuits are then separated one from the other; each circuit is then mounted on a nonconductive base or substrate such that it may be further handled or provided with a protective cover.

Such nonconductive bases or substrates are typically divided out of a larger, thin sheet of a rigid insulating material, such as ceramic, that has arranged on one surface thereof a plurality of individual wiring blocks. Each wiring block on the sheet comprises a wiring path and connections designed for the semiconductor chip to be placed thereon. These wiring blocks are formed on the insulating sheet in rows and columns that are separated one from the other by isolating regions known as kerfs.

A respective semiconductor chip is then electrically bonded to each respective block and the sheet is then divided in each kerf to singularize the blocks one from the other. In this way, each chip is provided with a respective substrate or base that is suitable for receiving a protective cover over the chip.

An early method of individualizing or singularizing such substrates from such a larger sheet consisted of sawing the insulating sheet in the kerf areas between the blocks. This method was found to be very slow and caused fine debris to be deposited on the surface of the blocks requiring follow-up cleaning steps. Moreover such cleaning steps were often ineffective in removing debris lodged beneath chips that were mounted on each block prior to the sawing action.

A later method consisted of scribing, on the sheet, a first set of scribed lines in the row kerfs and a second set of scribed lines in the column kerfs, which are perpendicular to the first set of scribed lines to create a plurality of cross hatched lines on the sheet surface. Using this process, the scribe lines enclose a plurality of defined enclosed regions on the substrate surface. A printed circuit wiring block is then formed in each scribe defined region and a respective chip is mounted on each printed circuit block. Next the chip carrying scribed sheet is placed on an elastic base and the sheet is fractured along the scribed lines by passing a roller over the sheet in a first direction parallel to the first set of the scribed lines and then passing the roller over the sheet in a second direction that is parallel to the second set of scribed lines, and at right angles to the first direction. This method, however, proved unsatisfactory because of variations in the force exerted on the roller and in the elasticity of the base, causing fractures to occur in the sheet in regions other than along the scribed lines. Still further, because chips had been mounted on the sheet prior to passing the roller over the surface of the unit, the rolling action was found to cause deformations and/or breaking of the conductive bonds between the chips and the underlying wiring blocks on the ceramic substrate. All of these difficulties resulted in excessive failure rates.

Another method employed a machine in which the chip carrying scribed sheet was placed against a convex die and a steel band was drawn against the chip mounted sheet, forcing the sheet against the die and causing the sheet to fracture along the first set of scribed lines, and then turning the partially broken substrate ninety degrees to fracture the substrate on the first set of lines. This machine also had difficulties associated with it for when used on a production line the tension on the band was found to be difficult to control and if the tension was even just slightly excessive, the blocks themselves were broken or cracked in undesired regions. Also the movement of the band across the surface of the chips mounted on the blocks often caused deformations and/or breaking of the conductive bonds between the chips and the underlying wiring blocks again resulting in undesirable losses.

A further method of subdividing such a scribed sheet carrying chips thereon used two sets of mating convex and concave arched dies positioned inline. The direction of the curves of the dies of the second set being positioned at a right angle with respect to the direction of the curves in the first set. The scribed sheet, to be subdivided, is mounted on an adhesive tape passing between both sets of dies. The sheet, is then positioned between the dies of the first set so that the convex die could be moved to force the scribed sheet against its mating concave die to break the sheet along a first set of the crosshatched scribed lines, following which the convex die was retracted, the tape moved between the second set of dies and the process repeated to fracture the sheet along the second set of scribed lines. In this arrangement each die in a set must be exactly positioned with respect to its mating die, for any misalignment of the dies or improper spacing between the dies when closed can result in either un-separated portions of the sheet or breakage of the sheet in undesired areas or breaking or distortion of the chip to block bonds. Further it was found that the first set of mating dies could cause a distortion in the tape resulting in an inappropriate shifting and misalignment of the sheet under the second set of dies. These problems also resulted in undesirable failure rates. Because of these difficulties a better mechanism and process for subdividing or singularizing a chip carrying sheet has long been sought.

SUMMARY OF THE INVENTION

The present invention has been designed to overcome the difficulties found in the prior art and does so through the use of an apparatus using a single die or anvil having a fixed convex arch and a conformable carrier mechanism carrying a previously scribed sheet of brittle material that is to be divided into regular individual pieces.

The surface of the sheet is cross hatched by forming first and second sets of scribe lines in the kerf areas between the chips. Each scribe line in a respective set is positioned in its own kerf and traverses the entire width of the sheet and is parallel to every other scribe line in the same set. The lines in one set are arranged perpendicular to the lines in the other set thus providing the cross hatched lines across the surface of the sheet.

Once scribed and populated with chips, the sheet is loaded into and sandwiched in a carrier having been formed of flexible and conformable, upper and lower carrier elements. The loaded carrier is then placed beneath an arched anvil of a suitable drive mechanism capable of applying fluidic pressure, such that a first set of scribed lines is parallel to the arch of the anvil. The carrier, carrying the sheet, is then forced by the fluid of the drive mechanism to conform to the arch of the anvil, while the anvil is rigidly held in a first known position at a specified distance above the carrier. Because the force used to conform the carrier to the anvil is a fluid it is applied with equal force over the entire surface of the carrier and it need only be sufficient to force the carrier, containing the scribed sheet to conform to the arch of the anvil, thereby fracturing or breaking the sheet along the set of scribe lines parallel to the arch of the anvil. Once the sheet is so fractured, the force is removed from the drive mechanism allowing the carrier to return to its initial position, the anvil is then raised above the carrier and rotated ninety degrees to a second known and fixed position such that the arch of the anvil, in this second position, is now ninety degrees to its previous direction. Once the anvil is in this second position, the anvil is lowered once again towards the top surface of the carrier and held there as described above. The drive mechanism is again used to force the carrier and the scribed, chip populated sheet contained therein to again conform to the arch of the rotated anvil thereby fracturing the sheet along the second set of scribe lines.

Further by designing the upper element of the carrier with a grid, formed by a plurality of ribs forming an open cross hatched framework with each rib overlying the scribed cross hatched lines in the sheet, breakage of the sheet only along the crossed hatched scribe lines is assured. Furthermore by having the openings defined by the ribs overlying the chips on the surface of the pressure applied by the drive mechanism is not applied to the surface of the chips thus assuring that the chips and their wiring block connections are not stressed, deformed or broken as could occur with the prior art techniques.

Still further, by providing such a grid in the conformable carrier of the invention and using fluidic pressure to force the conformable carrier containing the chip loaded sheet against the same anvil to fracture the sheet along both sets of scribe lines, the damage to the separated chips, the substrates, or the chip to substrate connections that were encountered by when using the prior art mechanisms is eliminated.

Accordingly, it is an object of the present invention to provide an apparatus for subdividing or singularizing a sheet of brittle material into a plurality of discrete or individual regular sections It is a another object of the present invention to provide a method for the accurate, automatic separation or singularization of a sheet of brittle insulating material into a plurality of discrete chip carrying substrates ready for installation in an electronic package.

It is still a further object of the present embodiments of the invention to provide a method and an apparatus for singularizing a ceramic sheet carrying thereon a plurality of semiconductor circuits arranged and connected to circuitry on the sheet in a predetermined array without damaging the semiconductor circuits or the connections between the sheet and the circuits affixed thereto.

These objects, features and advantages of the present embodiments of the invention will become further apparent to those skilled in the art from the following detailed description taken in conjunction with the accompanying drawings wherein:

DETAILED DESCRIPTION OF THE INVENTION

Figure 1:
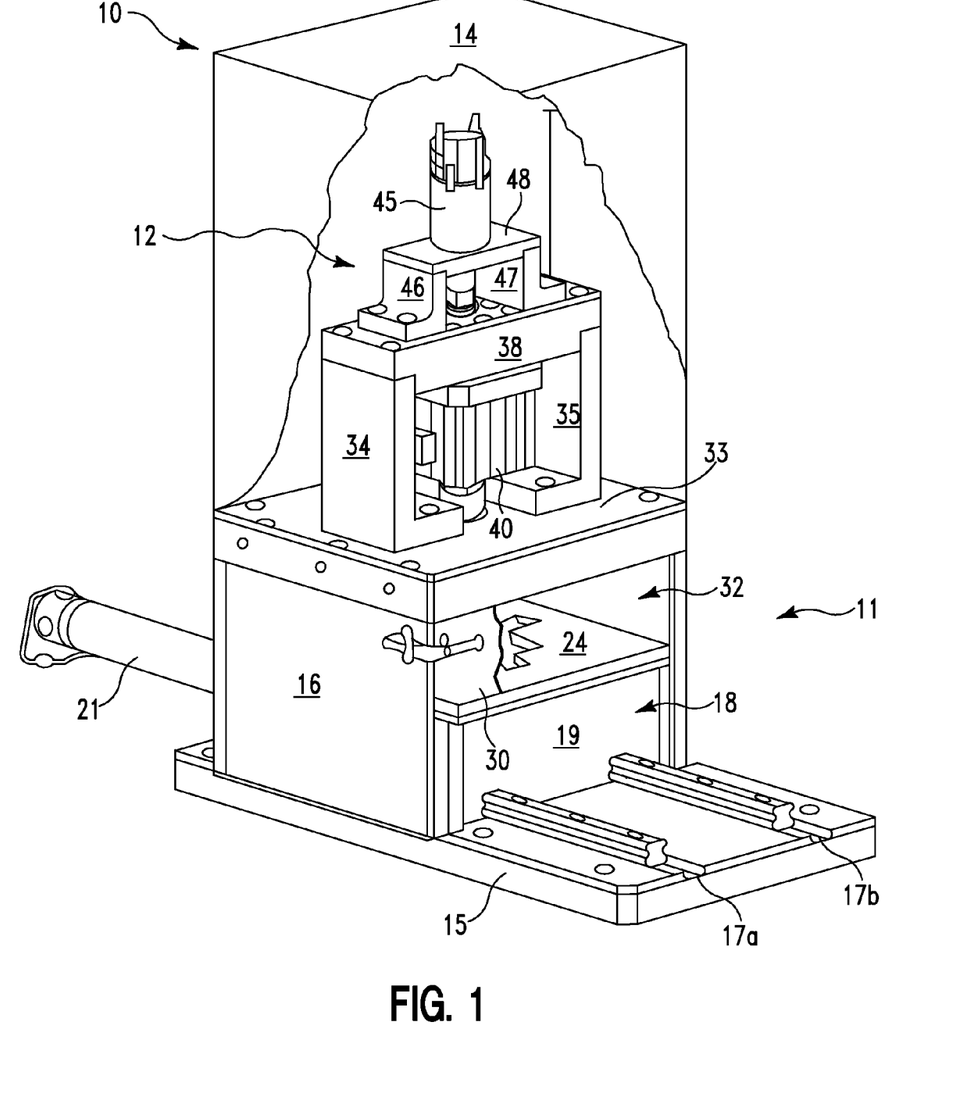
FIG. 1 is a perspective view of an apparatus provided in accordance with a preferred embodiment of the present invention for automatically singularizing a sheet of a brittle material such as ceramic provided with a regular arrangements of circuit blocks each of which has a respective semiconductor device electrically bonded thereto.
Figure 2:
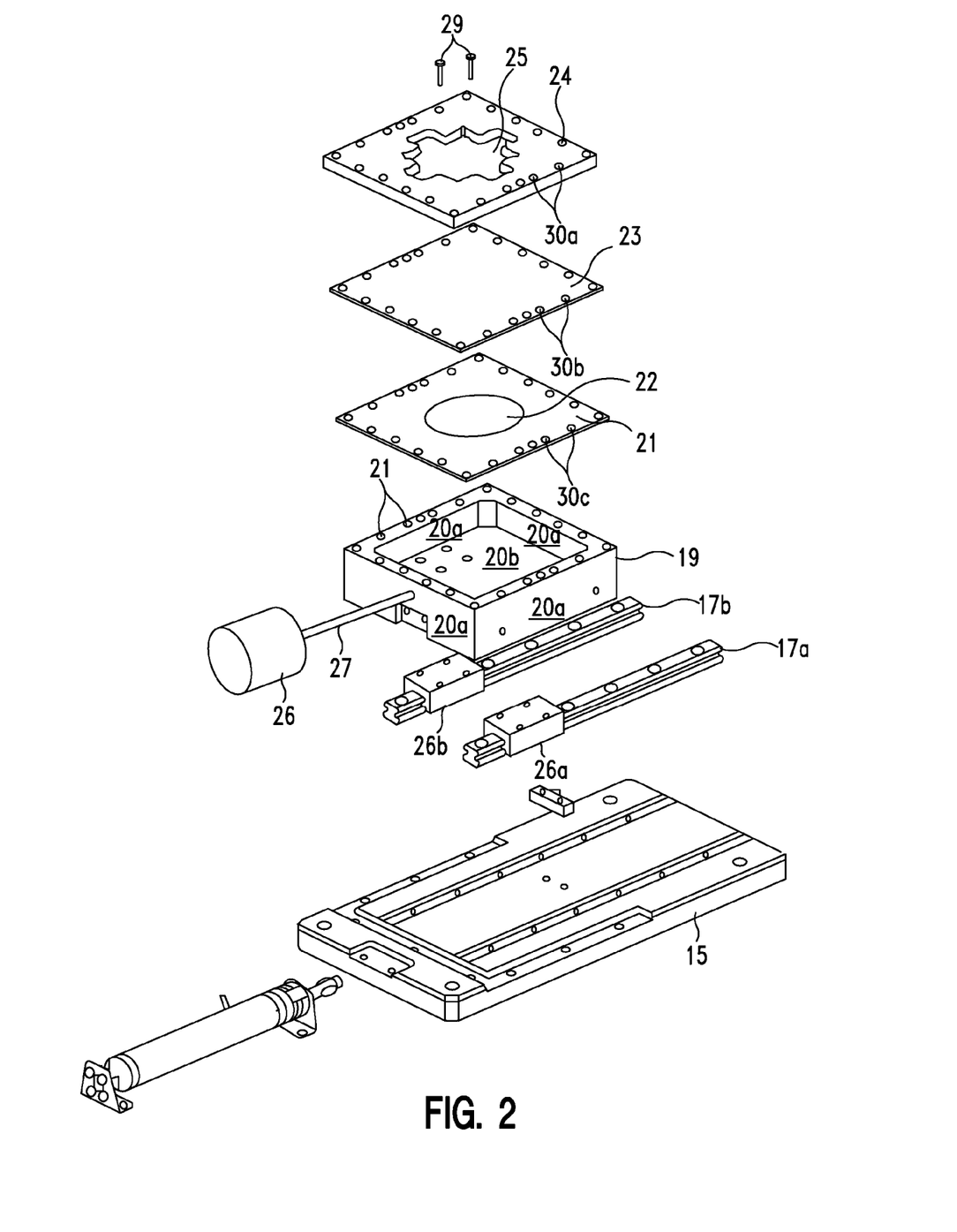
FIG. 2 is an exploded view of the lower portion of FIG. 1 containing the fluid drive mechanism of the apparatus.
Figure 3:
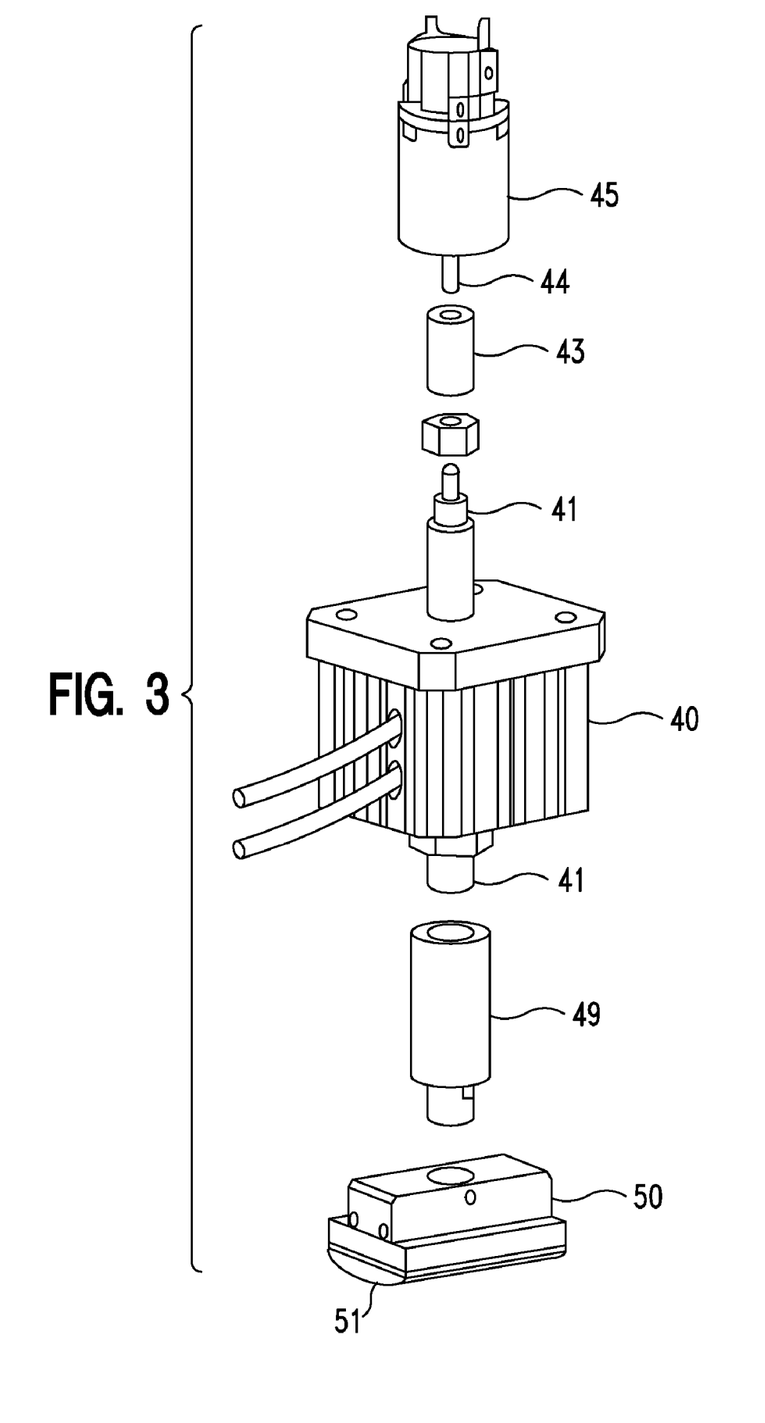
FIG. 3 is a partial exploded view of the anvil positioning mechanism of the apparatus illustrated in FIG. 1.

The apparatus 10, as shown in FIGS. 1, 2 and 3, is comprised of a lower portion 11 containing an enclosed carrier support on a fluidic pressure applying unit, an anvil and an upper portion 12 that contains an anvil positioning and drive mechanism.

The lower portion 11 is contained in an enclosure 16. This enclosure 16 is supported on a base plate 15. The enclosure 16 has two sections 18 and 32. The lower section 18 contains a pressure containment apparatus and its upper section 32 provides an anvil chamber. On the base plate 15 there is provided a pair of parallel rails 17a and 17b which carry the pressure containment apparatus which is shown in detail in FIG. 2.

As shown in FIG. 2, the pressure containment apparatus is a 28,900 mm square box 19 having side walls 20a and a unitary bottom 20b. The top of the side walls 20a are sealed with a 3.2 mm thick, metallic cover plate 21. Over this cover plate 21 there is disposed a thin flexible, elastic, resilient and conformable membrane 23. The membrane 23 may be comprised, for example, of a sheet of high grade Buna-N Rubber (Electrostatic Discharge Protection) that is 1.6 mm thick. The cover plate 21, has a central circular aperture 22 that is of a diameter smaller than the longest diagonal of the carrier to be placed therein, such that the weight of the carrier is effectively supported by the cover plate 21, and not by the membrane 23. For example, when the sheet to be singularized is 50 mm by 50 mm the carrier size is 81 mm by 81 mm. The diagonal of the carrier is 114.5 mm, the central aperture 22 of plate 21 will be at a maximum of 100 mm in diameter. Over the membrane is positioned a rigid metallic carrier locator plate 24 that is 12 mm in thickness which has a central aperture 25, for example, in the form of a quadrate cross whose central square section must accommodate the carrier to be placed therein, as will be described below. It should be understood that the details given above as to dimensions, shapes and the materials used can and will vary depending on the size and thickness of the sheet being fractured and can be readily established by any competent engineer.

The cover plate 21, the membrane 23 and the locator plate 24 are all secured to the top of the side walls 20a, of chamber or box 19, by a plurality of screws 29 that pass through holes 30c around the edges of the plate 21, holes 30b around the edges of membrane 23, and holes 30a around the edges of the carrier locator plate 24 into tapped holes 31 in the top of the side walls 20a to form a leak proof pressure seal with the upper rim of the side walls 20a of the chamber 19. A flexible pressure line 27, couples the interior of the pressure chamber 19 to a suitable fluid supply such as an air compressor 26. Above the chamber 19 and behind door 30 there is positioned the anvil chamber 32 which contains an anvil 50 as shown in FIG. 3.

Above the anvil chamber 32 there is provided on the top surface 33 of enclosure 16, a first spaced pair of L shaped supports 34 and 35 that are spanned by a support cross piece 38 that carries on its underside a reciprocating piston 40 such as a CDQ2KB63F-15DM-A73HL piston sold by the SMC company that has an extended central shaft 41 attached to it. The upper end of shaft 41 passes up through a suitable aperture in the cross piece 38 where it is connected by a coupling 43 to the shaft 44 of a suitable mechanism 45 for rotating the anvil 50. This rotating mechanism 45 may be, for example, any suitable device such as a rotary pneumatic cylinder or an electrically driven stepping motor and is held a fixed distance above the cross piece 38, by a pair of support arms 46 and 47 and a mount plate 48.

As shown in FIG. 3, the lower end of the central shaft 41 of the piston 40 is coupled via support 49 to an anvil 50, having an arched lower surface 51, such that the anvil 50 can be suspended directly in the anvil chamber 32 over the central square section of the quadrate cross opening 25 in the center of plate 24 in which a flexible carrier apparatus 60 can be placed. As noted previously, the central square opening in the quadrate cross opening 25 is designed to accommodate the carrier 60 that is to be placed therein and the anvil 50 is designed such that its length will be approximately equal to the length of the carrier sited in the central square section of the quadrate cross 25.

Figure 4:
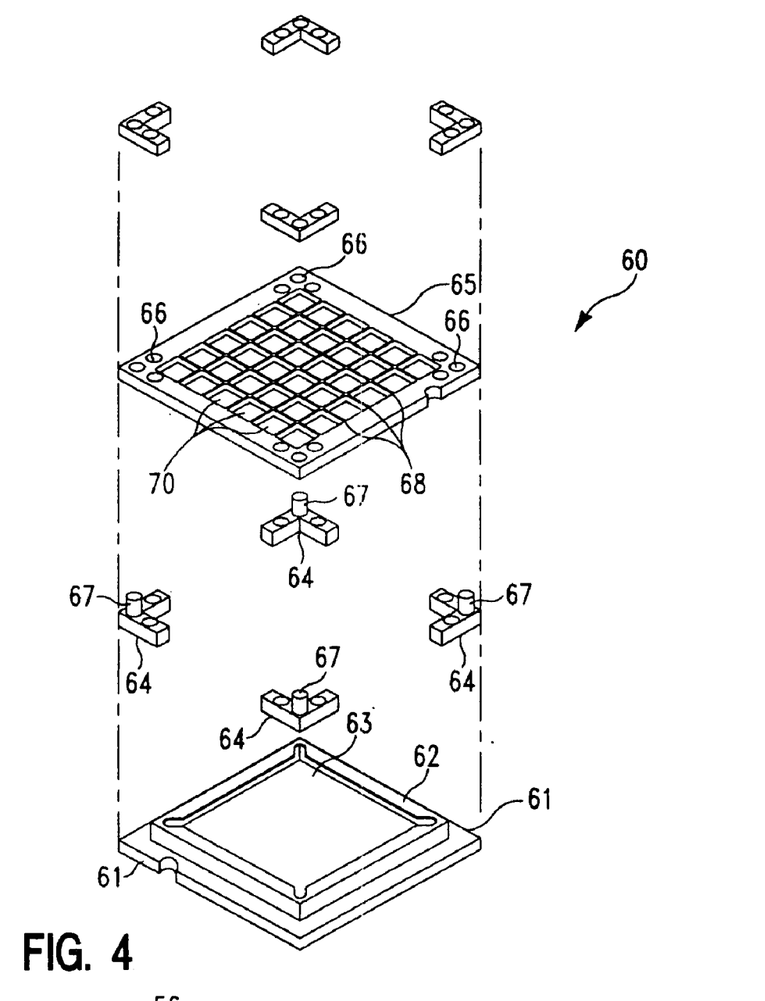
FIG. 4 is an exploded view of the conformable carrier used in the apparatus of FIG. 1.
Figure 5:
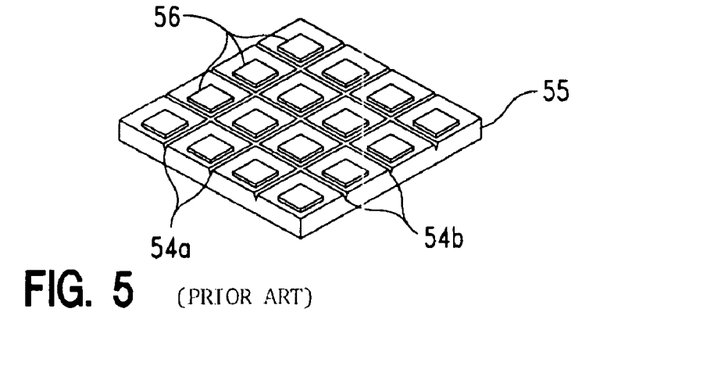
FIG. 5 depicts a scribed ceramic sheet provided with wiring blocks and chips thereon.
Figure 6:
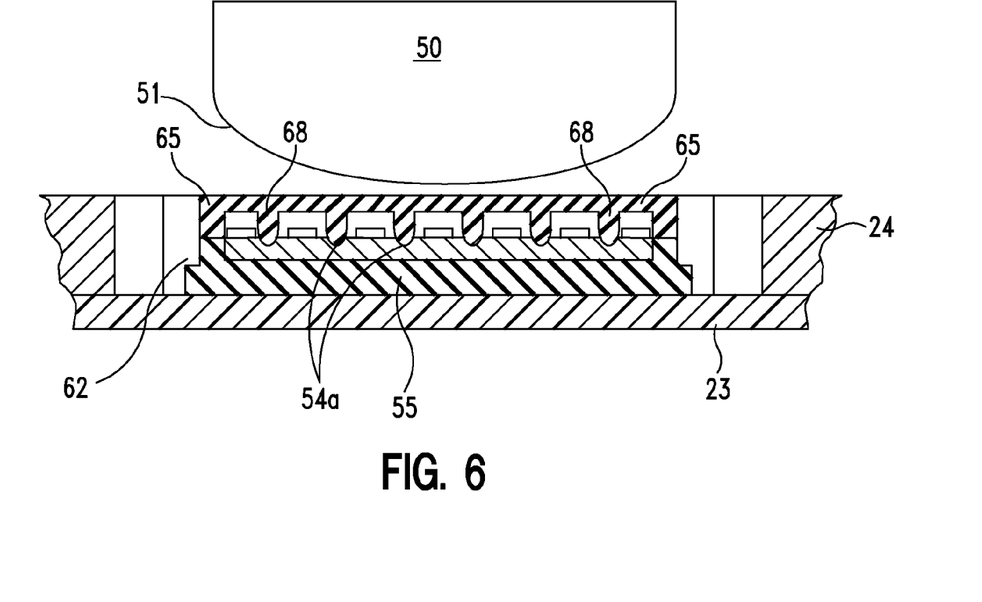
FIG. 6 is a cross sectional view of the conformable carrier containing a chip mounted and scribed and positioned beneath the arched anvil before the apparatus is pressurized.
Figure 7:
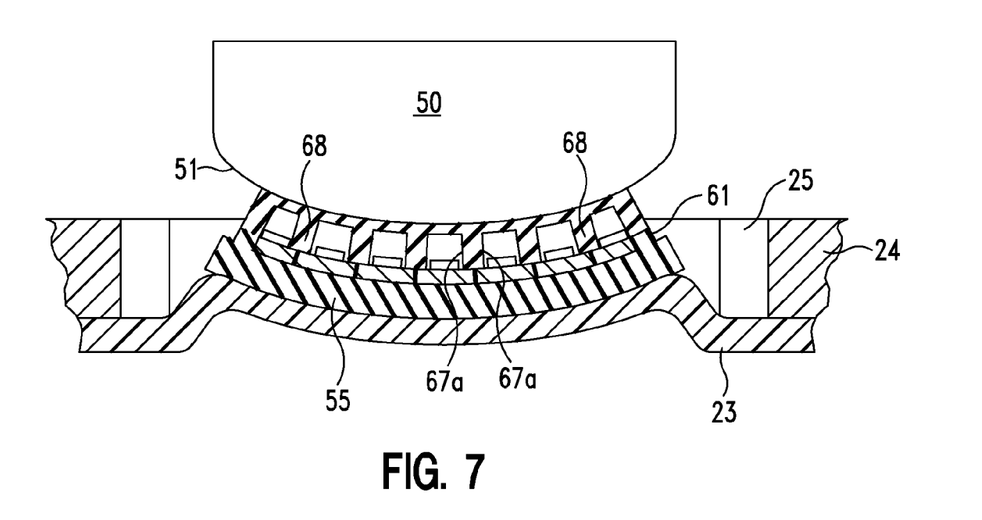
FIG. 7 is a cross sectional view of the conformable carrier containing a chip mounted and scribed when the apparatus is pressurized and the carrier is forced to conform to the arch of the anvil.

The carrier 60, shown in FIGS. 4, 6 and 7 is comprised of a base or lower element 61 which is flat and formed from a sheet of black polyurethane having a thickness of about 9.53 mm. The central portion 63 of the lower carrier element 61 is enclosed by a wall 62 in which a scribed and printed ceramic sheet 55, populated with semiconductors chips or devices, as illustrated in FIG. 5 can be placed. If needed, the bottom surface of the central portion 63 can be configured, in order to accommodate any connections (pins, BGA, etc.) that might be provided on the bottom of the sheet. The height of the wall 62 is set equal to or slightly thinner than the thickness of the ceramic sheet 55 to be placed therein. On each corner 59 of the portion of the lower carrier element 61 outside of the wall 62 are secured positioning devices 64, each of which is provided with a set of upright studs 67. Each respective device 64 interfaces with a respective set of locating holes 66 in each corner of an upper carrier element 65. The center of the upper carrier element has an open grid pattern 70 formed by a plurality of cross hatched ribs 68 therein. The ribs 68 are designed to match, and to overlie the crossed hatched scribe lines 54 on the underlying ceramic sheet 55 placed in the carrier as depicted in FIG. 6. The openings 70, in the upper carrier element, defined by the ribs 68, are designed to be larger than the chips and underlying wiring blocks placed on the ceramic sheet and to overlie the scribe lines in the underlying sheet 55. By making the height of these ribs 68 greater than the height of the chips 56 bonded to the ceramic sheet 55, as shown in FIG. 6, the arched surface 51 of the anvil 50, used to fracture the sheet along the scribed lines, is prevented from coming in to contact with the chips or applying any force to the chips or their connections to their underlying printed circuit blocks. By so protecting the chips, these ribs, assure that each chip and its underlying connections to its wiring block cannot be stressed by the anvil and thus will remain undisturbed during the fracturing and separation of the sheet contained in the carrier.

The process of accomplishing this protective separation of a scribed chip mounted ceramic sheet will be now be particularly described especially in conjunction with FIGS. 4, 5, 6 and 7.

Initially, as shown in FIG. 5, a previously scribed ceramic sheet 55, typically 50 mm by 50 mm and ranging from 0.7 to 1.5 mm in thickness has a plurality of wiring blocks (not shown) formed thereon by a state of the art process. The wiring blocks are laid out on the surface of the ceramic sheet within defined kerf areas which contain the notched cross hatched scribe lines 54a and 54b as is well known to the art. Subsequently, a respective semiconductor chip 56 is bonded to each wiring block again using processes well known to the art. The wiring blocks are, of course, designed to accommodate the chips to be placed thereon. It should be noted that the area within the cross hatched scribe lines 54a and 54b can be either square or rectangular in form. It is also to be noted that the sheet is broken along these scribe lies 54a and 54b to form singularized substrates.

At present, square singularized substrates typically range from 8 to 15 mm square and rectangular singularized substrates are typically, 4 mm by 6 mm or larger. It is of course understood that both the chips and the ceramic sheets can be either smaller or larger than these described sizes and that the carrier will be designed to match the sheet and/or chips affixed thereto. Usually when square substrates are to be singularized from the ceramic sheet the grid ribs 68 will form square openings and when oblong substrates are to be singularized from the ceramic sheet, grid ribs 68 will form oblong openings.

Once the scribed and cleaned ceramic sheet 55 to be singularized has been provided with chips 56 as shown in FIG. 5, it is loaded into the walled enclosure 63 provided in the carrier base 61 and a carrier cover 65 having an appropriate grid formation 68 is placed thereon. The cylinder 40 is activated to raise and hold the lowest surface 51 of anvil 50 about 6 mm above the top surface of plate 24. Pressure drawer 19 is now opened by moving it out of enclosure 11 on rails 17a and 17b. Once drawer 19 is outside enclosure 11, a carrier containing a scribed, ceramic sheet 55 is placed in the square center of quadrate cross opening 25 in the plate 24 so that it rests over of flexible membrane 23 affixed to the top of drawer 19. The bulk of the carrier is thus positioned over opening 22 in plate 21. It is of course to be recalled that the corners of the carrier extend beyond the edges of opening 22 and thus the corners are positioned over plate 21. Drawer 19 is then moved back into enclosure 11 such that the carrier is positioned directly beneath raised anvil 51.

Cylinder 40 is now activated to push anvil 50 down, about 6 mm, such that, as shown in FIG. 6, the lowest point of its arch 51 is held just above or just touching the center of the upper surface of carrier 60 containing scribed ceramic sheet 55 that is to be separated. Thus, as illustrated in FIG. 6, arch 51 of anvil 50 is parallel to a first set of scribe lines in the sheet.

The interior of drawer 19 is now pressurized to between about 20 and 40 PSI. As shown in FIG. 7 this causes membrane 23 to expand upwards through quadrate cross opening 25 such that as carrier 60 and the scribed, chip loaded, ceramic sheet 55, contained therein, is forced to conform to arch 51 of anvil 50, positioned above the carrier, sheet 55 is caused to fracture along scribed lines 54a. Because carrier 60 is now being forced upwards against anvil 50, it is to be understood that anvil 50 must be held fixed in its position with a force equal to or greater than the force being applied to carrier 60 by the expanded membrane. By so holding the anvil in affixed position carrier 60 and its contained ceramic sheet 55 is forced to conform to the arch of anvil 50 and the sheet breaks along first set of scribe lines 54a parallel to the direction of arch 51 of anvil 50 as shown in FIG. 7. Once the sheet is broken the pressure in drawer 19 is reduced permitting the membrane 23 and carrier 60 to return to their initial flat positions.

At this time, anvil 50 is again raised above the carrier surface about 6 mm by activating cylinder 40. Once raised the cylinder is rotated 90 degrees by rotating apparatus 45 to place arch 51 of anvil 50 perpendicular with respect to its original position and parallel to the second set of scribe lines 54b in the sheet. Cylinder 40 is again activated to lower anvil 50, as described above, such that the center of arch 51 of anvil 50 is again just touching the upper surface of the carrier. Again, the interior of drawer 19 is pressurized and membrane 23 expands upwards through quadrate cross opening 25 causing carrier 60 and the ceramic sheet contained therein to be forced upwards against arch 51 of anvil 50 positioned above the carrier. Because anvil 50 is now positioned at 90 degrees to its first position the sheet in the carrier is broken along second set of scribe lines 54b. Again it is to be noted that the pressure in cylinder 40 must be sufficient to hold anvil 50 in a fixed position as carrier 60 is forced against anvil 50 with a force sufficient to break carrier enclosed sheet 55 along the second set of scribe lines 54b. When ceramic sheet 55 in the carrier fractures along this second set of scribe lines the chips are singularized.

Once sheet 55 has been so singularized the pressure in drawer 19 is reduced, anvil 50 is again retracted from the surface of the carrier, drawer 19 is opened, the carrier removed, and the singularized substrates are removed therefrom. At this time, a new scribed, chip carrying ceramic sheet may be inserted in the carrier and the entire cycle described above is repeated.

Because the grid in the upper segment is open, force is applied by anvil 50 to the sheet contained in the carrier only by ribs 68 that lie along the scribe lines. Thus in the embodiment of the present invention, force is not applied to the chips, mounted on the sheet being fractured, as occurred in the prior art techniques. By eliminating such direct pressure on the chips mounted on the sheet, as occurred in the prior art, the present invention assures that the electrical connections or bonds between the chips and their underlying circuits on the sheet are preserved and remain unaffected during the sheet breaking action. This embodiment of the present invention thus avoids the problems of distortion or breakage of the chip to circuit connections encountered by the prior art equipment or processes.

The present invention thus teaches a simple, inexpensive and automatic machine and process for overcoming the difficulties found in the prior art and does so through the use of an apparatus using but a single convex arched anvil against which a conformable carrier mechanism carrying a previously scribed sheet of brittle material that is to be divided into regular individual pieces can be forced by an equalized fluid pressure.

This completes the description of the preferred embodiment of the invention. Since changes may be made in the above construction without departing from the scope of the invention described herein, it is intended that all the matter contained in the above description or shown in the accompanying drawings shall be interpreted as illustrative and not in a limiting sense.

Other alternatives and modifications will now become apparent to those skilled in the art without departing from the spirit and scope of the invention as set forth in the following claims.

The embodiments of the invention in which an exclusive property or privilege is claimed are defined as follows:

1. An apparatus for subdividing or singularizing a sheet of brittle insulating material having scribe lines in a surface thereof into a plurality of rectangular pieces comprising:
    a fluidic pressure applying chamber supporting a flexible, elastic and resilient membrane;
    a flexible, elastic conformable carrier for supporting the sheet of brittle insulating material having a plurality of lines scribed in a surface thereof, positioned on said membrane;
    a mechanical arm for positioning a rigid convex, arched anvil above the said carrier in a first position;
    a drive mechanism for applying a fluidic force in said chamber to expand said membrane to force the conformable carrier and any sheet contained therein to conform to the arch of said anvil to fracture the contained sheet along the lines scribed in the sheet:
    a pressure release for removing said force from said chamber;
    a mechanical actuator for raising said anvil above said carrier;
    wherein said conformable carrier comprises a substantially flat base having a wall enclosed central portion for supporting the sheet of brittle material to be subdivided; and an upper carrier element having an open grid pattern formed by a first set of spaced parallel ribs and a second set of spaced parallel ribs with said second set being arranged perpendicular to said first set.

2. The apparatus of claim 1, wherein said arch of said anvil parallels said first set of ribs and the fluidic force in said chamber causes said membrane to expand to force said first set of ribs to conform to the arch of said anvil to fracture the sheet along a first set of scribe lines in said sheet placed in said carrier.

3. The apparatus of claim 2, wherein said the arch of said anvil parallels said second set of ribs and the fluidic force in said chamber causes said membrane to expand to force said second set of ribs to conform to the arch of said anvil to fracture the sheet along a second set of scribe lines in said sheet placed in said carrier.

4. The apparatus of claim 2, wherein there is further provided; A mechanical interface capable of rotating said anvil to a second position over said carrier in which the arch of the anvil parallels said second set of ribs;
    A hydraulic system for applying a fluidic force in said chamber to cause said membrane to expand and apply a force equally over the entire surface of said sheet containing conformable carrier to conform the arch of said anvil to fracture the sheet along the scribe lines in row kerfs to individualize each said rectangular block from any adjacent block.

5. The apparatus of claim 4, wherein a bottom surface of the central portion of said carrier is configured to accommodate any connections provided on the bottom of the sheet.

6. The apparatus of claim 1, wherein:
said sheet of brittle insulating material placed in said carrier has a plurality of printed circuits arranged on a surface thereof in rows and columns;
each row and each column being separated from any adjacent row or column by a scribed line; and
each circuit has a respective semiconductor chip mounted thereon;
each said printed circuit is mounted on a respective wiring block on a respective semiconductor chip.

7. The apparatus of claim 6, comprising;
an opening defined in said open grid pattern by said ribs being larger than said semiconductor chips mounted on said wiring blocks placed on said sheet of brittle insulating material;
a height of such ribs being greater than the height of the semiconductor chips bonded to the sheet placed in such carrier to prevent the anvil from coming in contact with the semiconductor chips or applying any force to the semiconductor chips or their connections to their underlying printed circuits.

8. The apparatus of claim 1, wherein:
an air pressure source applies the fluidic force in said chamber to cause said membrane to expand and distribute the force equally over the elastic sheet supporting the conformable carrier to force the carrier to conform to the arch of said anvil and fracture a sheet contained therein.

9. The apparatus of claim 8, wherein said carrier being formed of polyurethane having a thickness of about 9.53 mm.

10. The apparatus of claim 9, wherein a height of the wall is set equal to or slightly thinner than the thickness of the sheet of brittle material placed therein.

* * * * *